United States Patent
Anderson et al.

(10) Patent No.: US 11,227,943 B2
(45) Date of Patent: Jan. 18, 2022

(54) HIGH ELECTRON MOBILITY TRANSISTORS AND METHODS FOR FABRICATING THE SAME

(71) Applicant: GOVERNMENT OF THE UNITED STATES OF AMERICA, AS REPRESENTED BY THE SECRETARY OF THE NAVY, Arlington, VA (US)

(72) Inventors: Travis J. Anderson, Alexandria, VA (US); Virginia D. Wheeler, Alexandria, VA (US); Karl D. Hobart, Alexandria, VA (US); Francis J. Kub, Arnold, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 16/017,833

(22) Filed: Jun. 25, 2018

(65) Prior Publication Data
US 2018/0374944 A1    Dec. 27, 2018

Related U.S. Application Data

(60) Provisional application No. 62/523,824, filed on Jun. 23, 2017.

(51) Int. Cl.
| | |
|---|---|
| *H01L 29/778* | (2006.01) |
| *H01L 29/20* | (2006.01) |
| *H01L 29/205* | (2006.01) |
| *H01L 29/51* | (2006.01) |
| *H01L 29/66* | (2006.01) |
| *H01L 21/02* | (2006.01) |

(Continued)

(52) U.S. Cl.
CPC ........ *H01L 29/7787* (2013.01); *H01L 21/022* (2013.01); *H01L 21/0228* (2013.01); *H01L 21/0254* (2013.01); *H01L 21/0262* (2013.01); *H01L 21/02189* (2013.01); *H01L 21/02205* (2013.01); *H01L 21/28264* (2013.01); *H01L 29/205* (2013.01); *H01L 29/408* (2013.01); *H01L 29/4236* (2013.01); *H01L 29/513* (2013.01); *H01L 29/517* (2013.01); *H01L 29/66462* (2013.01); *H01L 29/7786* (2013.01); *H01L 21/02274* (2013.01); *H01L 23/3171* (2013.01); *H01L 29/2003* (2013.01); *H01L 29/452* (2013.01)

(58) Field of Classification Search
None
See application file for complete search history.

(56) References Cited

U.S. PATENT DOCUMENTS

| | | | | |
|---|---|---|---|---|
| 2004/0051152 | A1* | 3/2004 | Nakajima | H01L 29/66181 257/411 |
| 2018/0331182 | A1* | 11/2018 | Then | H01L 29/66462 |

* cited by examiner

*Primary Examiner* — Nicholas J Tobergte
*Assistant Examiner* — Kien C Ly
(74) *Attorney, Agent, or Firm* — U.S. Naval Research Laboratory

(57) ABSTRACT

A high electron mobility transistor (HEMT) and method of producing the same are provided. The HEMT includes a barrier layer formed on a GaN layer. The HEMT also includes a $ZrO_2$ gate dielectric layer formed by either a ZTB precursor, a TDMA-Zr precursor, or both. The HEMT may also include a recess in the barrier layer in the gate region of the HEMT. The HEMTs may operate in an enhancement mode.

8 Claims, 19 Drawing Sheets

(51) Int. Cl.
   *H01L 21/28*   (2006.01)
   *H01L 29/423*  (2006.01)
   *H01L 29/40*   (2006.01)
   *H01L 23/31*   (2006.01)
   *H01L 29/45*   (2006.01)

US 11,227,943 B2

HIGH ELECTRON MOBILITY TRANSISTORS AND METHODS FOR FABRICATING THE SAME

BACKGROUND

Field of the Invention

The present application relates generally to high electron mobility transistors and methods of fabricating the same.

Description of Related Art

High electron mobility transistors (HEMTs) are a form of field effect transistors that are of significant interest in next generation radiofrequency (RF) power amplifiers and monolithic microwave integrated circuits. HEMTs are formed, in part, by creating a junction between two materials with different bandgaps. This junction is referred to as a heterojunction. A common example of heterojunction used in HEMTs is a junction between undoped GaAs and AlGaAs. In a conventional HEMT formed from AlGaAs and undoped GaAs, electrons from the AlGaAs layer enter the undoped GaAs and become trapped near the heterojunction, forming a two-dimensional electron gas (2DEG). The 2DEG has few, if any, impurities that may limit electron mobility and thus is capable of transmitting very high currents with low resistivity.

However, in the conventional HEMT described above, the device is always on. This is because the 2DEG is the conducting channel and since it is formed by the creation of the heterojunction, rather than the application of a gate voltage, the conducting channel is present even when there is no voltage applied to the gate. Such an HEMT is said to be a depletion mode device. Depletion mode devices have well-known disadvantages for power-switching applications. Thus, it may be beneficial to provide a HEMT that operates in an enhancement mode. In an enhancement mode, the device is normally off (i.e., the conducting channel between the source and drain is not available), and a gate voltage is necessary in order to make the conducting channel available.

Another issue with HEMTs is gate leakage current. A gate dielectric in an HEMT has been shown to reduce gate leakage resulting in improved reliability and reduced off-state power consumption. However, while leakage current can be mitigated by the addition of a gate dielectric, that comes at the expense of additional effective barrier thickness. Thus, it may be desirable to have HEMTs that can operate in an enhancement mode while still reducing leakage current.

SUMMARY OF THE INVENTION

One or more the above limitations may be diminished by structures and methods described herein.

In one embodiment, a high electron mobility transistor is provided. The transistor includes: a source, a drain, a GaN layer, a barrier layer disposed on the GaN layer, a gate metal, and a zirconium oxide dielectric layer at least partially surrounding the gate metal, where the zirconium oxide dielectric layer is formed from a zirconium (IV) tert-butoxide precursor.

In another embodiment, a method of forming a high electron mobility transistor is provided. A barrier layer is formed on a GaN substrate. A source and a drain region are formed. A portion of the barrier layer is removed. A zirconium oxide dielectric is formed in a region corresponding to the removed portion of the barrier layer. The zirconium oxide dielectric is formed from a zirconium (IV) tert-butoxide precursor. A gate metal is formed such that the gate metal is at least partially surrounded by the zirconium oxide dielectric.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings.

Figure 1:
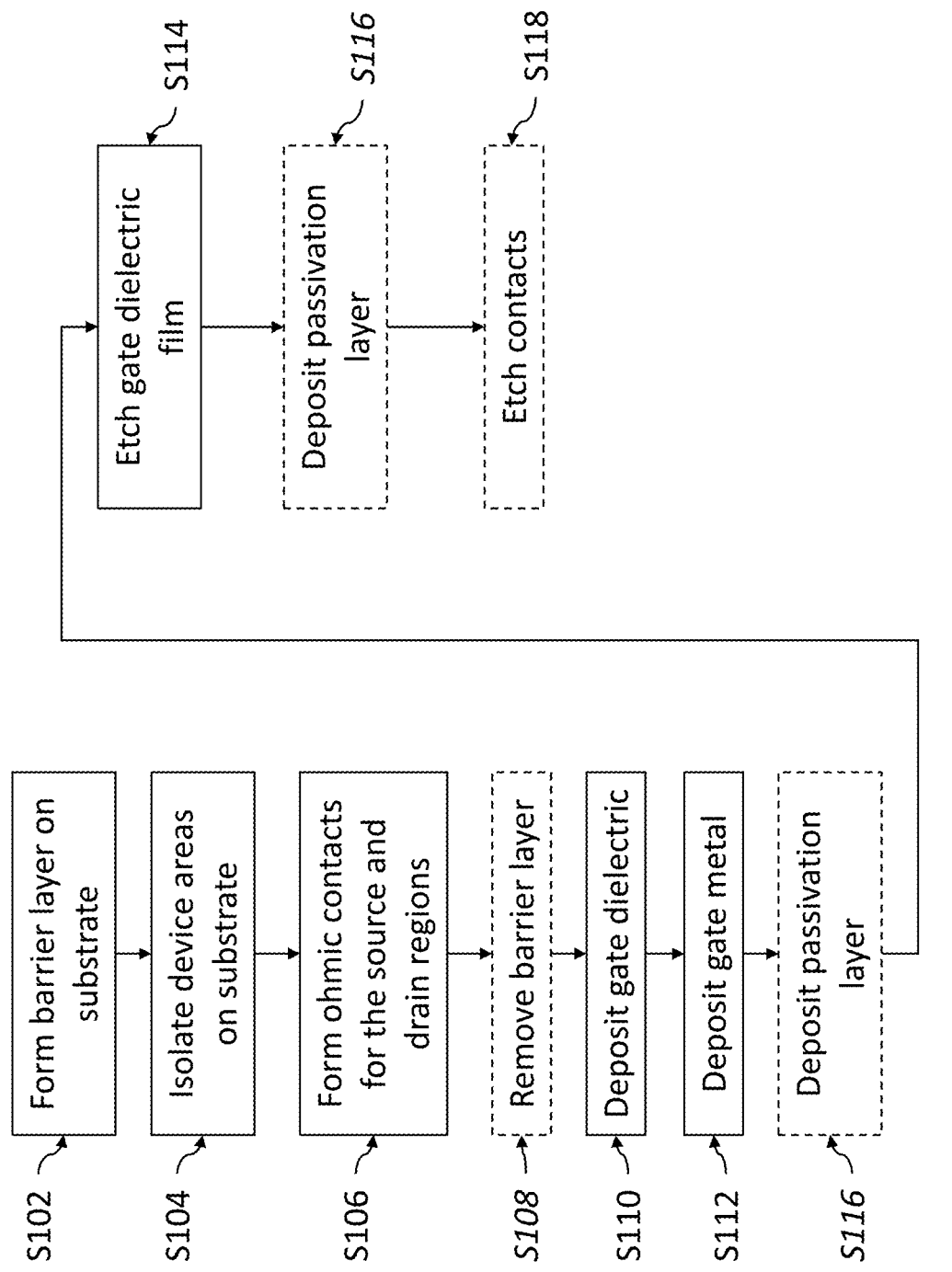
FIG. 1 illustrates the steps in forming a HEMT with a $ZrO_2$ dielectric layer, according to an exemplary embodiment.

Different ones of the Figures may have at least some reference numerals that are the same in order to identify the same components, although a detailed description of each such component may not be provided below with respect to each Figure.

DETAILED DESCRIPTION OF THE PREFERRED EMBODIMENTS

In accordance with example aspects described herein are HEMTs and methods of fabricating the same.

Disclosed herein are HEMTs than include a zirconium oxide ($ZrO_2$) layer as a gate dielectric. $ZrO_2$ has several properties that make it a preferred gate dielectric. It has a high dielectric constant (25), a large band gap (7.8 eV) and a high breakdown voltage (15-20 MV/cm). FIG. 1 illustrates the steps in forming a HEMT with a $ZrO_2$ dielectric layer, according to an exemplary embodiment. FIGS. 2A-2G are cross-sectional images showing the various stages of forming the HEMT, according to the process set forth in FIG. 1.

Figure 2A:
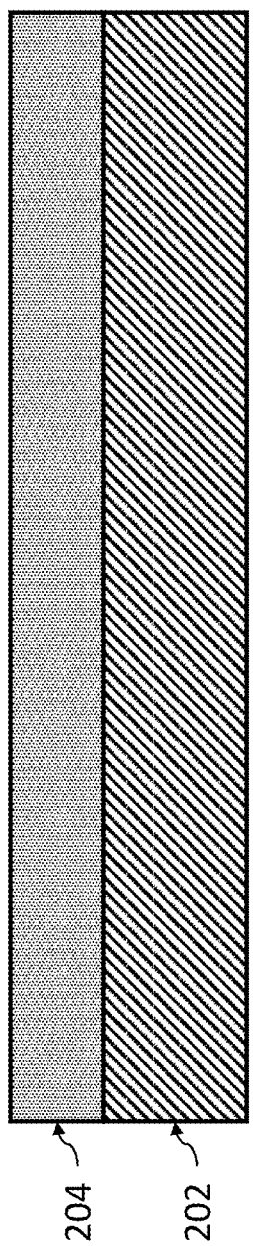
FIGS. 2A-2G are cross-sectional images showing various stages of forming the HEMT according to one embodiment.

In S102, a heterostructure comprising a barrier layer 204 grown on an underlying layer 202 is formed, as illustrated in FIG. 2A. In an exemplary embodiment, the underlying layer is a GaN layer. A 2DEG layer (not shown) is generated in the GaN layer 202 by the formation of the heterostructure. The heterostructure formed by the GaN layer 202 and the barrier layer 204 may itself be disposed on a substrate (not shown) that is suitable for III-N epitaxy, examples of which include: sapphire, Si, SiN, and GaN. In a preferred embodiment, GaN layer 202 is unintentionally doped GaN that is approximately 2 microns thick. Barrier layer 204 may be InAlGaN or AlGaN. In one embodiment, barrier layer 204 is approximately 18 nm thick. Barrier layer 204 may be formed by deposition including, for example, metal organic chemical vapor deposition (MOCVD). Next, in S104, device areas are isolated by, for example, mesa etching or ion implantation.

Figure 2B:
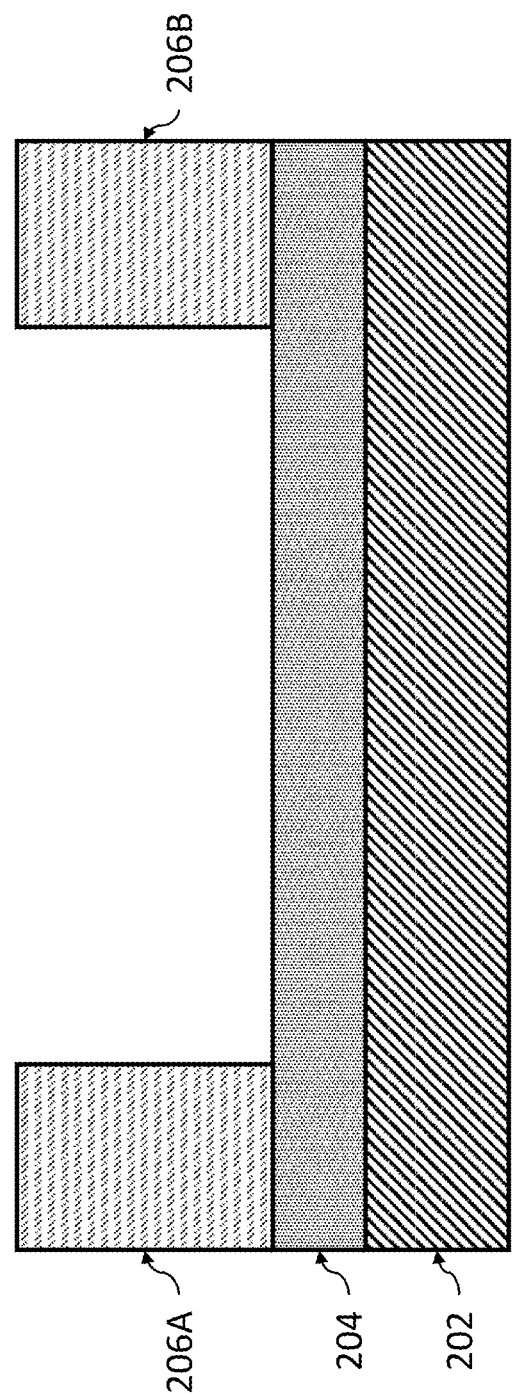
Figure 2C:
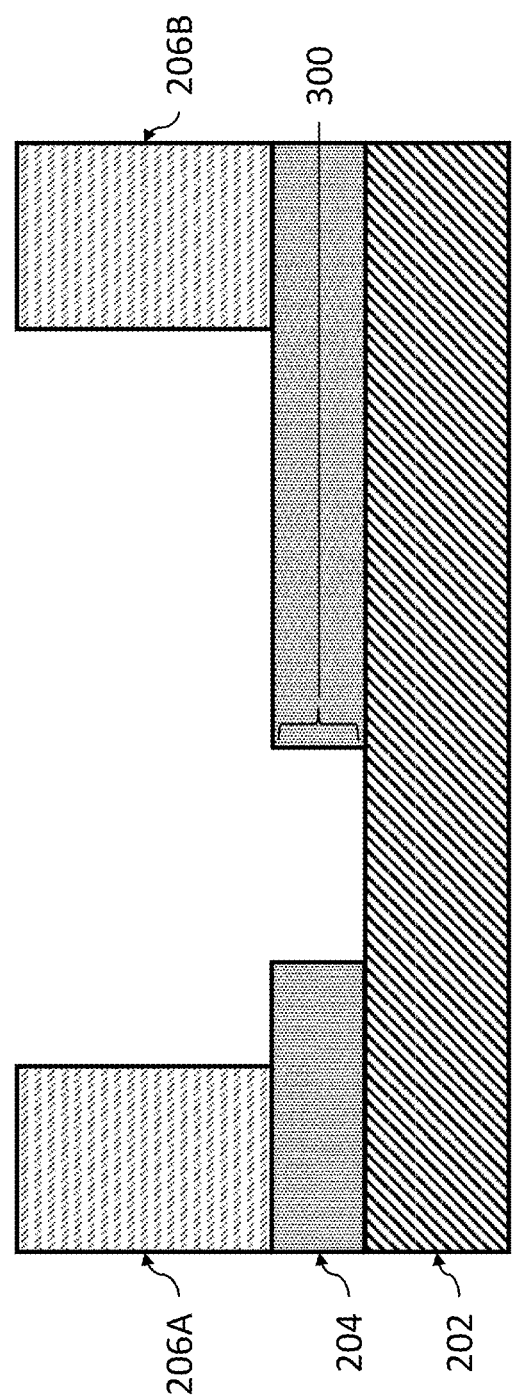

In S106, ohmic contacts are formed by deposition so as to define a source 206A and a drain 206B, as shown in FIG. 2B. Exemplary ohmic metals include Ti, Al, Ni, and Au. Next, an optional step (S108) of removing the barrier layer 204 in the gate region of the HEMT may be performed. As discussed in further detail below, removing a portion of the barrier layer 204 in the gate region affects the voltage at which the HEMT turns on (the threshold voltage). In one embodiment, the barrier layer 204 in the gate region of the HEMT is completely removed so as to expose substrate 202, as shown in FIG. 2C, and create a barrier recess 300. In another embodiment, the barrier layer 204 is only partially removed in the gate region of the HEMT so as to not expose substrate 202. As one of ordinary skill will appreciate, the removal of the barrier layer 204 (both partially and completely) to form a barrier recess 300 affects the 2DEG. If the barrier layer 204 is completely removed in the gate region, then a 2DEG may not be formed in the gate region since there is no heterojunction between the barrier layer 204 and the GaN layer 202. Barrier layer 204 may be removed by an etching technique including, for example, plasma etching or wet etching down to a stop layer that has been previously deposited.

Next, in S110, a gate dielectric 208 is deposited. In one embodiment, the gate dielectric is deposited by atomic layer deposition (ALD). In a preferred embodiment, the gate dielectric is a $ZrO_2$ film deposited using a precursor. The precursor may be: zirconium (IV) tert-butoxide (ZTB), tetrakis (dimethylamino) zirconium (TDMA-Zr), or both. $ZrO_2$ films deposited using the ZTB precursor ($ZrO_2$-ZTB film) exhibit a high density of negative charge in the oxide due to the presence of excess oxygen in the $ZrO_2$-ZTB film. This is a result of the fact that ZTB is an oxygen-containing metal precursor, unlike TDMA-Zr. As discussed below, the presence of the negative charge in the oxide layer causes a significant, and unexpected, positive shift in the threshold voltage (i.e., the gate voltage required to turn the HEMT device on). Even without a barrier recess 300, the use of a ZTB precursor to form the $ZrO_2$ gate dielectric 208 raises the threshold voltage to near-zero, i.e., approaching an enhancement mode device. $ZrO_2$ films deposited using the TDMA-Zr precursor ($ZrO_2$-TDMA film) exhibit little charge in the oxide due to the stoichiometric nature of the film. In one embodiment, the thickness of the gate dielectric is between 20-40 nm, inclusive. These values are exemplary merely exemplary as the thickness of the $ZrO_2$-ZTB film can be varied to produce a desired threshold voltage. One method for depositing the $ZrO_2$ gate dielectric 208 is to use an Ultratech Savannah 200 atomic layer deposition reactor operating at 200° C. using ZTB and deionized water precursors.

Figure 4:
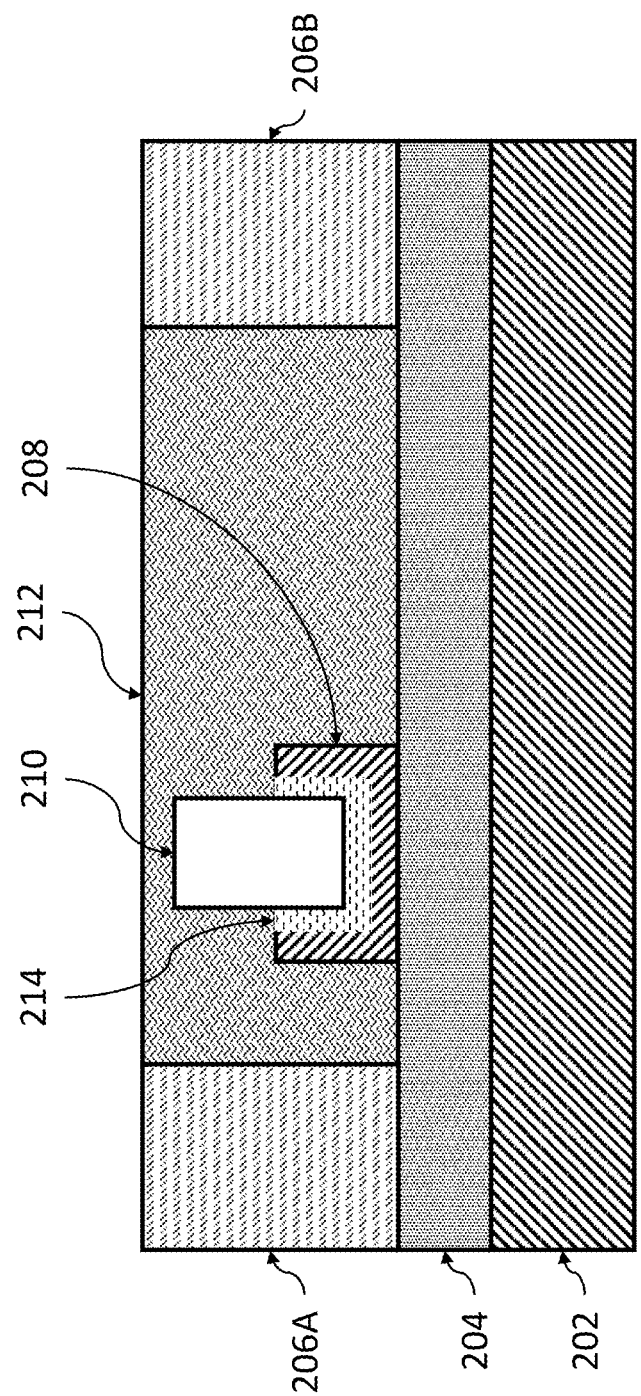
FIG. 4 illustrates an embodiment where the barrier layer was not removed.
Figure 5:
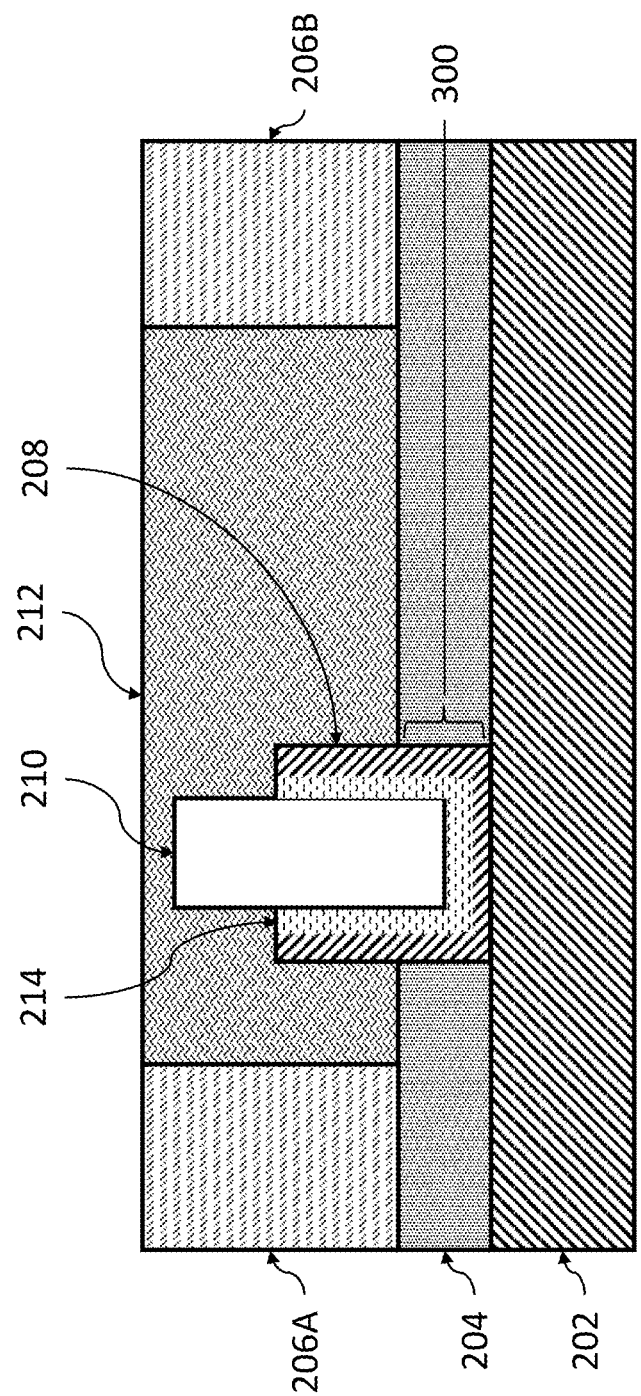
FIG. 5 illustrates an embodiment where the barrier layer was removed and the gate dielectric extends into the barrier layer.

In the case where both ZTB and TDMA-Zr are used as precursors, the result is a composite stack of $ZrO_2$ films forming the gate dielectric 208. Those films may be ordered, by for example ordering their depositions, such that a $ZrO_2$-ZTB film is adjacent to the gate metal 210 while a $ZrO_2$-TDMA film is adjacent to the barrier layer 204 or, if a complete barrier recess 300 is present, the GaN layer 202 (as shown in FIGS. 4 and 5). In another embodiment, the alternate may be true. The $ZrO_2$-TDMA film may be adjacent to the gate metal 210 while the $ZrO_2$-ZTB film may be adjacent to the barrier layer 204 or, if a complete barrier recess 300 is present, to the GaN layer 202. Of course, more than one layer of each precursor-type $ZrO_2$ film may also be present, such that there are plurality of $ZrO_2$-ZTB films and a plurality of $ZrO_2$-TDMA films, which in total form the gate dielectric layer 208. In such a case, the plurality of $ZrO_2$ films produced by one precursor may be alternately layered with the plurality of $ZrO_2$ films produced by the other precursor. The thicknesses of each precursor-type $ZrO_2$ film need not be the same. The $ZrO_2$-ZTB film(s) may be thicker than the $ZrO_2$-TDMA film(s), or vice versa. Varying the thickness of each precursor-type $ZrO_2$ film will affect the threshold voltage. For example, as discussed below, a gate dielectric formed from $ZrO_2$-ZTB alone combined with a full barrier recess 300 produces a threshold voltage of 3.92V; however, a composite gate dielectric 208 that includes one or more $ZrO_2$-TDMA films will reduce the threshold voltage from 3.92V. This is due to the fact that the $ZrO_2$-TDMA exhibits little charge in the oxide due to the stoichiometric nature of the film. Thus, the magnitude of the positive voltage shift due to the presence of the $ZrO_2$-ZTB film may be controlled by introducing a $ZrO_2$-TDMA film, and controlling one or more of: (i) the number of layers of each type of $ZrO_2$, (ii) their respective thicknesses, (iii) the order in which the types of $ZrO_2$ films are deposited, (iv) which type of $ZrO_2$ film is adjacent to the gate metal, and (v) which type of $ZrO_2$ film is adjacent to the barrier layer 204, or the GaN layer 202 as the case may be. Of course, the magnitude of the positive voltage shift may also be controlled by varying the depth of the barrier recess 300. Thus, there are two independent factors each of which may be varied to produce a desired threshold voltage.

Figure 2D:
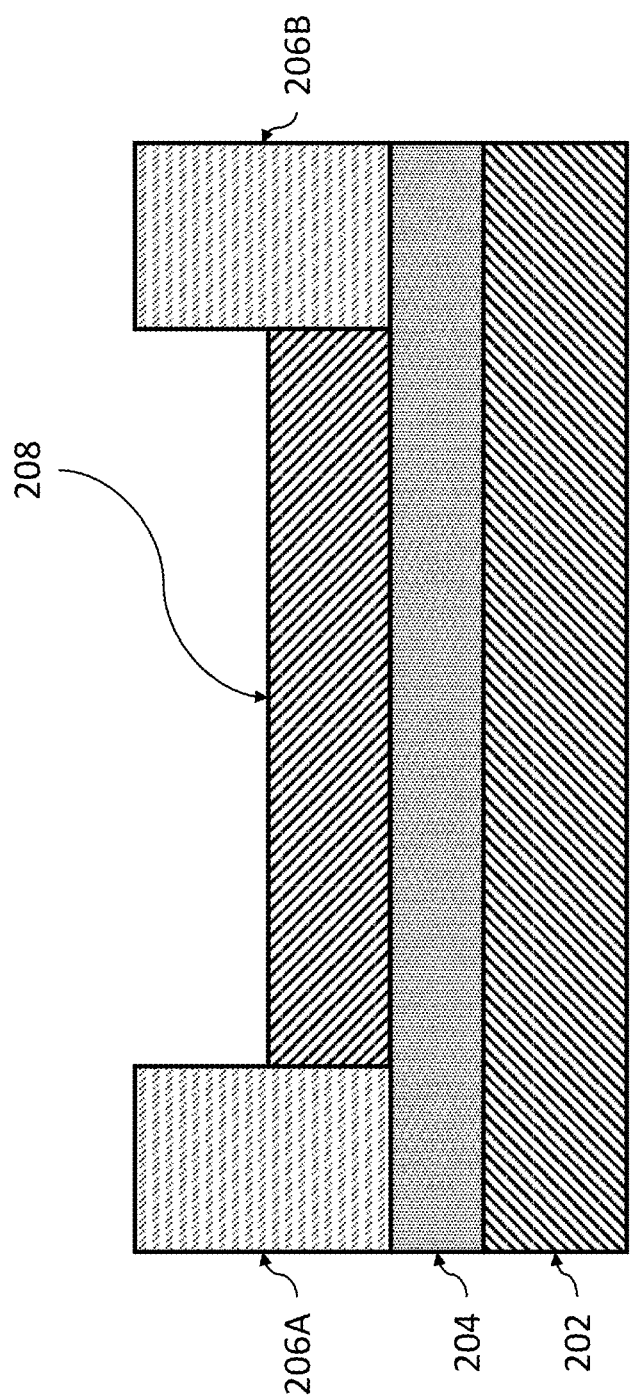
Figure 2E:
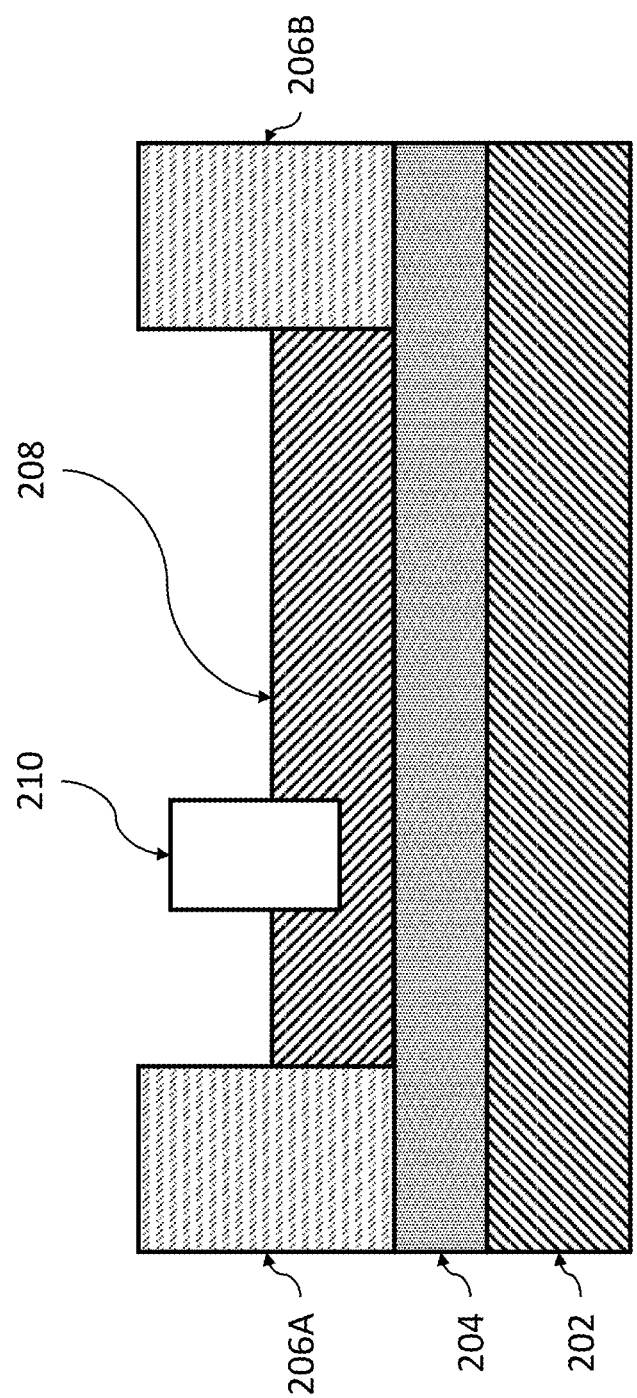
Figure 2F:
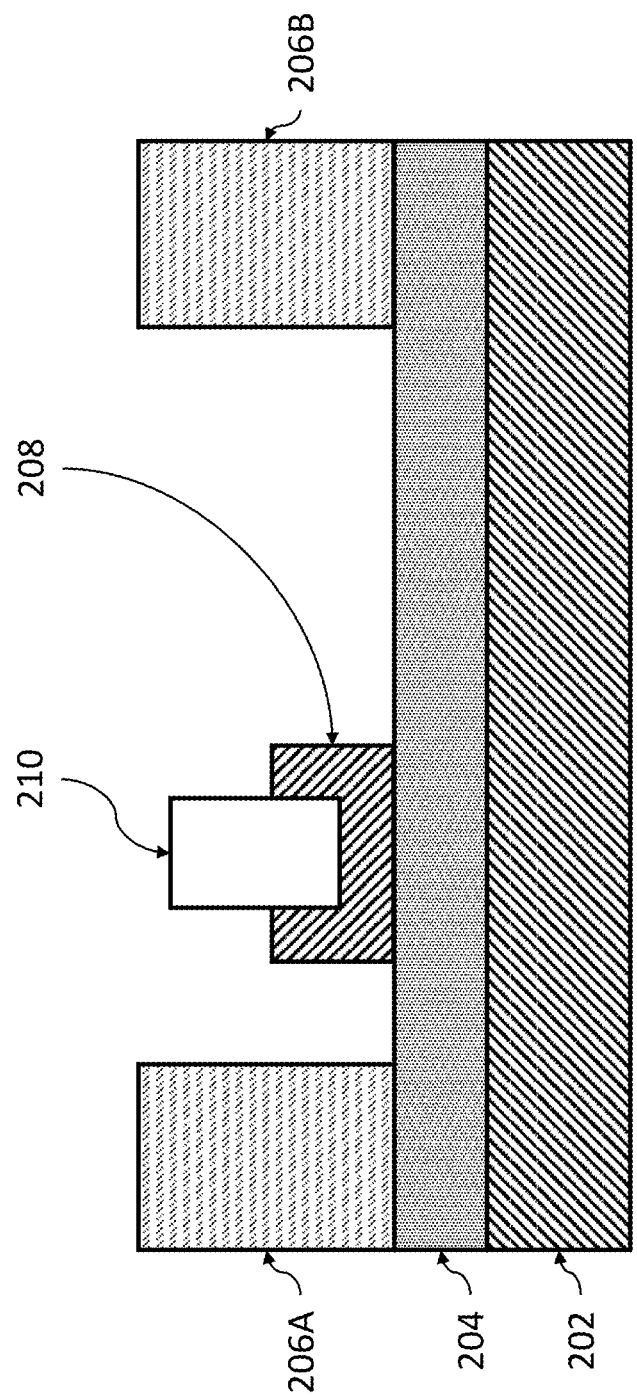
Figure 2G:
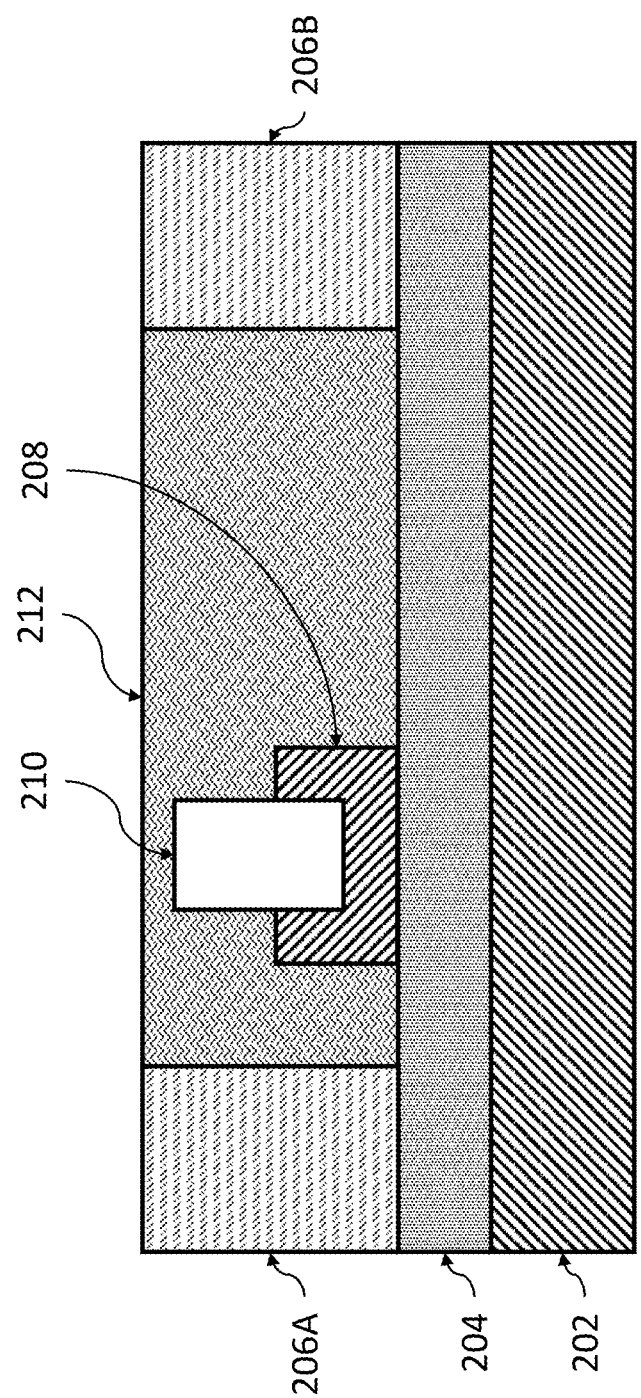

FIG. 2D is a cross-sectional view showing the in-formation HEMT after S110. As one of ordinary skill will appreciate, in FIG. 2D barrier layer 204 was not removed in S108 in the gate region of the HEMT. After the gate dielectric 208 is deposited, gate metal 210 is deposited in S112, as illustrated in FIG. 2E. In a preferred embodiment, the gate metal 210 is Ni/Au that is e-beam deposited. After the gate metal 210 is deposited, the gate dielectric 208 may be etched using a wet chemical treatment or plasma (S114), so as to expose the barrier layer 204, as illustrated in FIG. 2F. Finally, in S116, a passivation layer 212 may be deposited, as illustrated in FIG. 2G. The passivation layer may comprise $SiN_x$, AlN, or diamond films, and may be deposited by, for example, plasma-enhanced chemical vapor deposition (PECVD). In one embodiment, the passivation layer 212 may be deposited after the gate metal 210 is deposited in S112, but before the gate dielectric film is etched in S114, as illustrated in FIG. 1 by the dashed-line box S116 between S112 and S114. While an exemplary HEMT formed by the method of FIG. 1 is illustrated in FIG. 2G, this disclosure is not limited to the exemplary HEMT as shown in FIG. 2G, but includes other HEMTs formed by one or more permutations of the process illustrated in FIG. 1, as explained below.

Figure 3:
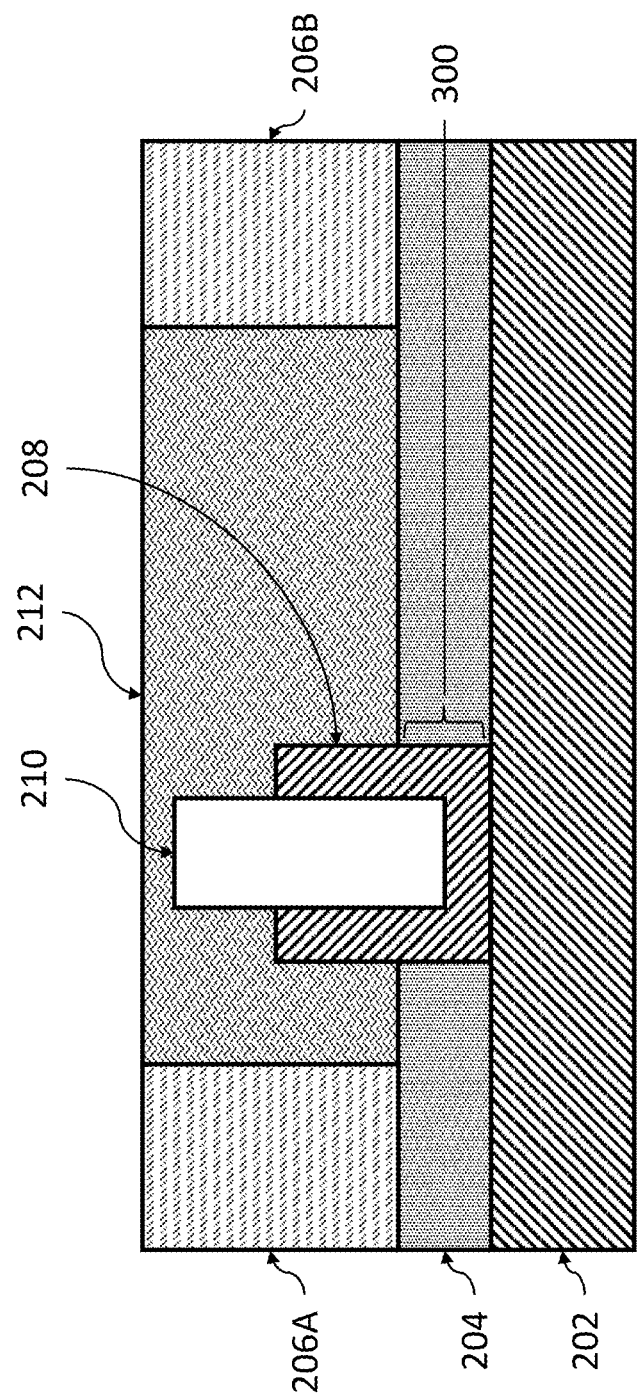
FIG. 3 illustrates an HEMT formed by the steps in FIG. 1, except the barrier layer in the gate region of the HEMT has been removed forming a barrier recess.

FIG. 3 illustrates an HEMT formed by the method outlined in FIG. 1, except in this case the barrier layer 204 was removed in S108 in the gate region of the HEMT forming a barrier recess 300. As discussed above, the barrier layer may be partially or completely removed, and thus the depth of the barrier recess 300 may be zero to the thickness of the barrier layer 204, or even greater. For example, in one embodiment, the barrier layer 204 may be approximately 18 nm thick, the barrier recess may be approximately 20 nm deep, and the dielectric layer 208 40 nm thick. Thus, in this example, the dielectric layer 208 would extend into the GaN layer 202, and completely through the barrier layer 204. In FIG. 3, the barrier recess 300 is the thickness of the barrier layer 204, and thus the gate dielectric 208 now extends down to the GaN layer 202 in the gate region of the HEMT. In addition, the gate metal 210 also extends into the barrier layer 204. As discussed in further detail below, these changes to the HEMT contribute to the positive shift in the threshold voltage, turning the HEMT into an enhancement mode device.

FIGS. 4-5 are cross-sectional views of HEMTs according to another embodiment in which both a $ZrO_2$-ZTB film 214 and a $ZrO_2$-TDMA film 208 are used as precursors in the gate dielectric formation step (S110). In one embodiment, the $ZrO_2$-TDMA film 208 is deposited first so as to be adjacent to barrier layer 204 or, as is the case in FIG. 5, the GaN layer 202. This arrangement may be beneficial as the $ZrO_2$-TDMA film 208 offers greater protection against current collapse as compared to the $ZrO_2$-ZTB film 214. FIG. 5, like FIG. 3 above, illustrates an embodiment where the barrier layer 204 was removed in S108 and thus the gate dielectric 208/214 now extends into the barrier layer 204. In the particular embodiment illustrated in FIG. 5 the gate dielectric 208/214 extends to the GaN layer 202.

Figure 6:
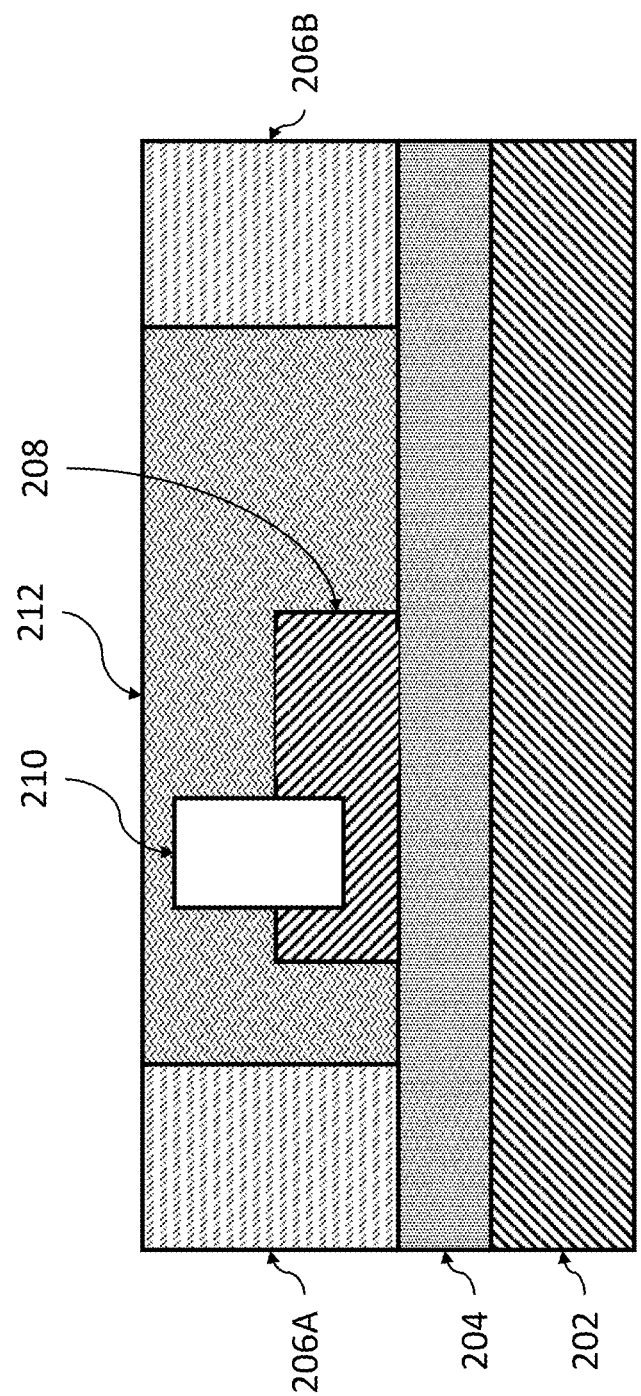
FIG. 6 illustrates an embodiment where the dielectric layer extends laterally into the access region.
Figure 7:
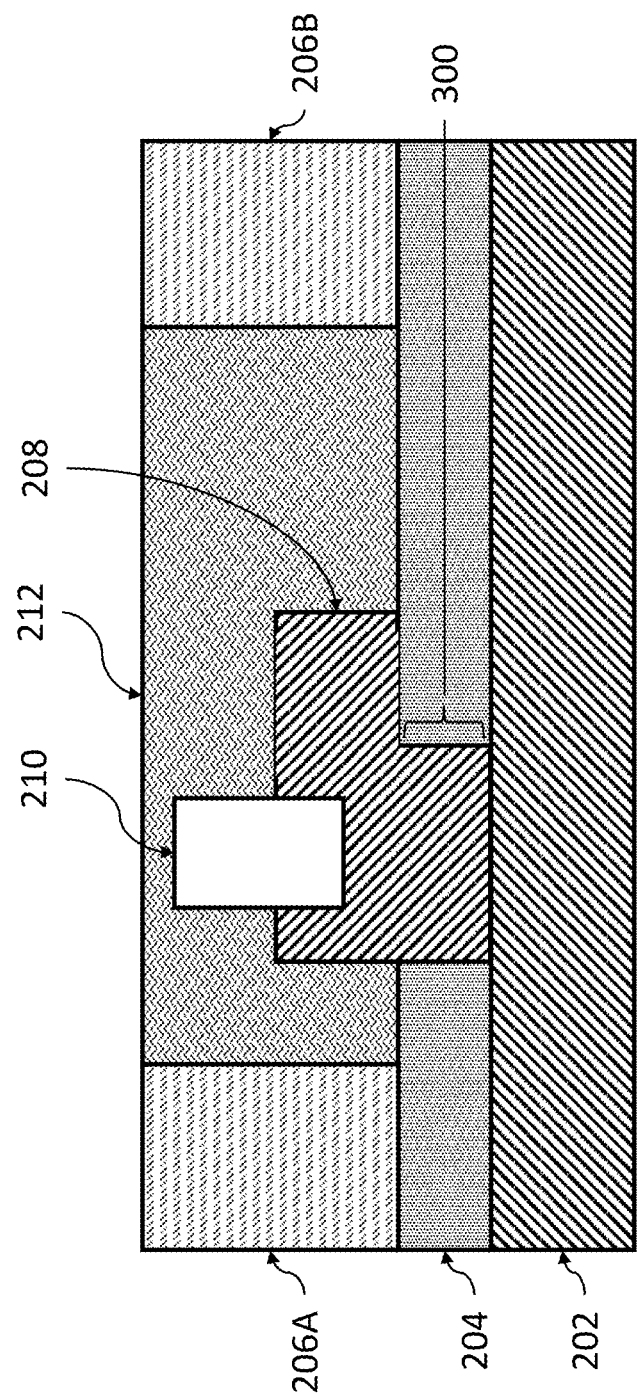
FIG. 7 illustrates an embodiment where the dielectric layer extends not only laterally into the access region, but also vertically into the barrier layer.

FIG. 6 is a cross-sectional view of a HEMT according to another embodiment. In FIG. 6, the dielectric layer 208 extends laterally into the access region for electric field spreading considerations. In the case where the dielectric layer 208 is a $ZrO_2$-ZTB film, the negative charge in the oxide layer would partially deplete the 2DEG in the access region of the transistor, resulting in a graded electric field profile. FIG. 7 is a cross-sectional view of an HEMT according to another embodiment. In FIG. 7, the dielectric layer 208 extends not only laterally into the access region, but also vertically into the barrier layer 204, like in FIGS. 3 and 5 above.

Figure 8:
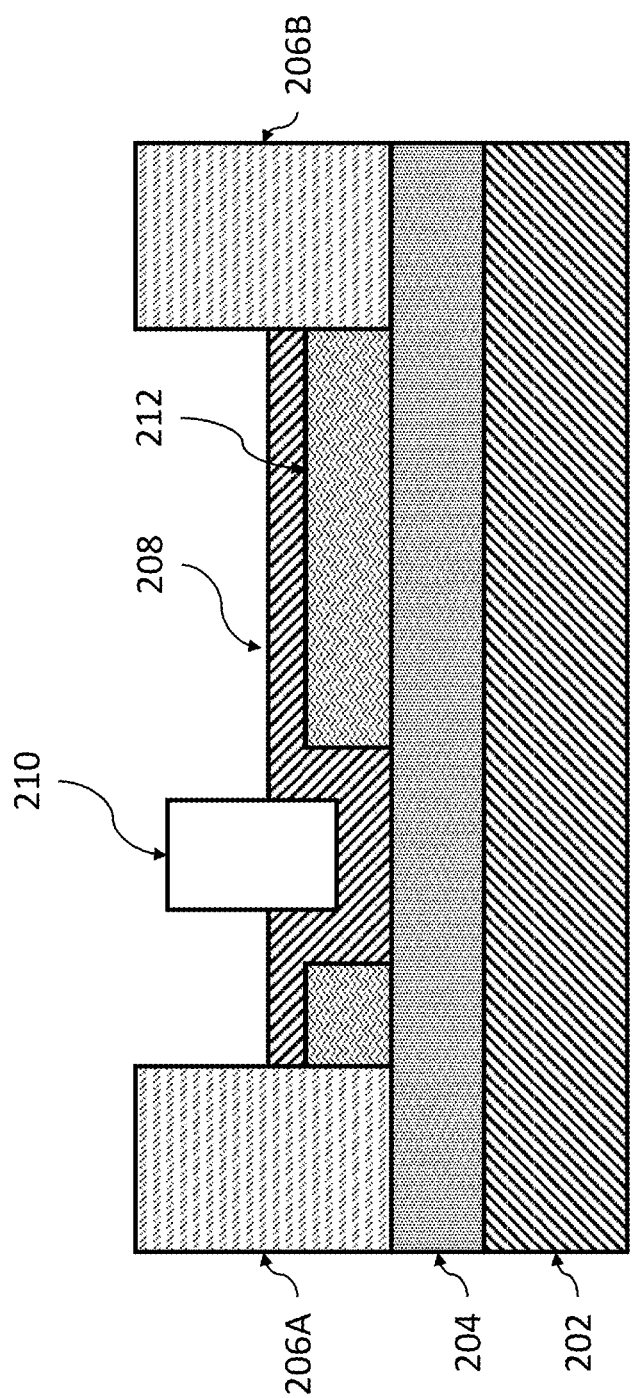
FIG. 8 illustrates an embodiment where a passivation layer is deposited before the dielectric layer is deposited.
Figure 9:
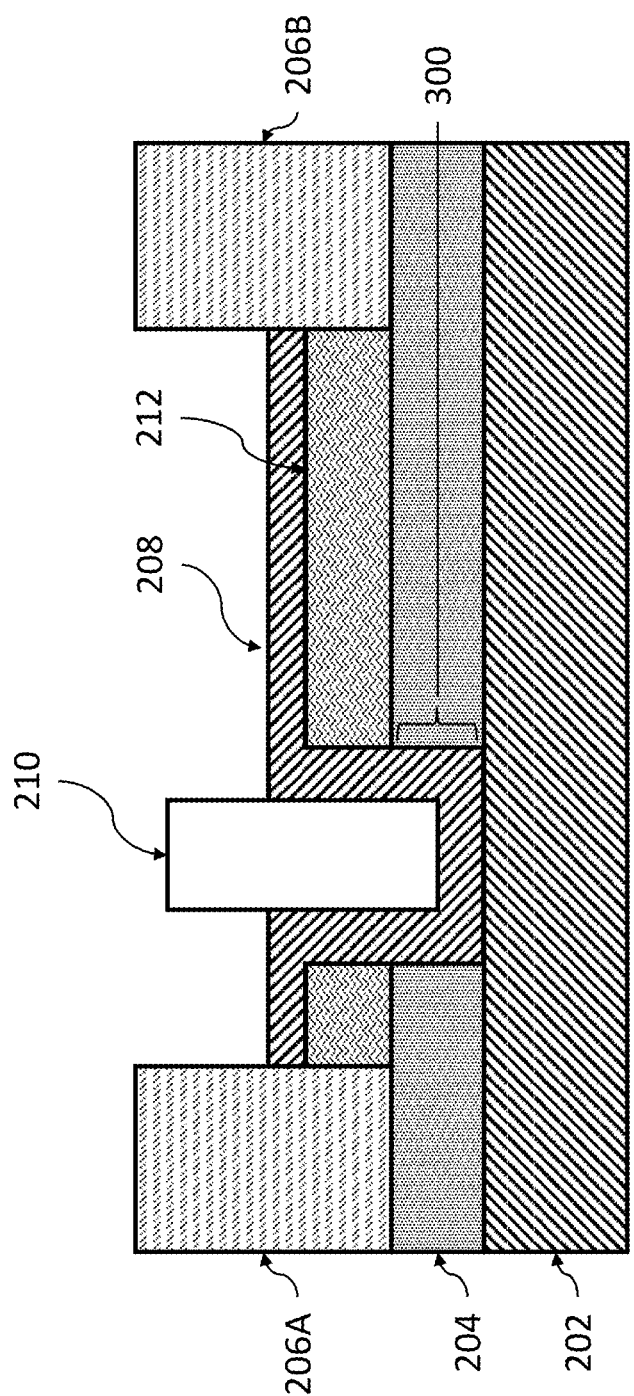
FIG. 9 illustrates an embodiment where a passivation layer is deposited before the dielectric layer and the dielectric layer extends vertically into the barrier layer.

FIGS. 8 and 9 are cross-sectional views of HEMTs according to other embodiments. In FIG. 8, the passivation layer 212 is deposited before the dielectric layer 208 is deposited, and thus appears above the passivation layers in FIG. 8. Like FIG. 8, in FIG. 9 the passivation layer 212 is also deposited before the dielectric layer 208, but like FIGS. 3, 5, and 7 above, the dielectric layer 208 extends vertically into the barrier layer.

Figure 10:
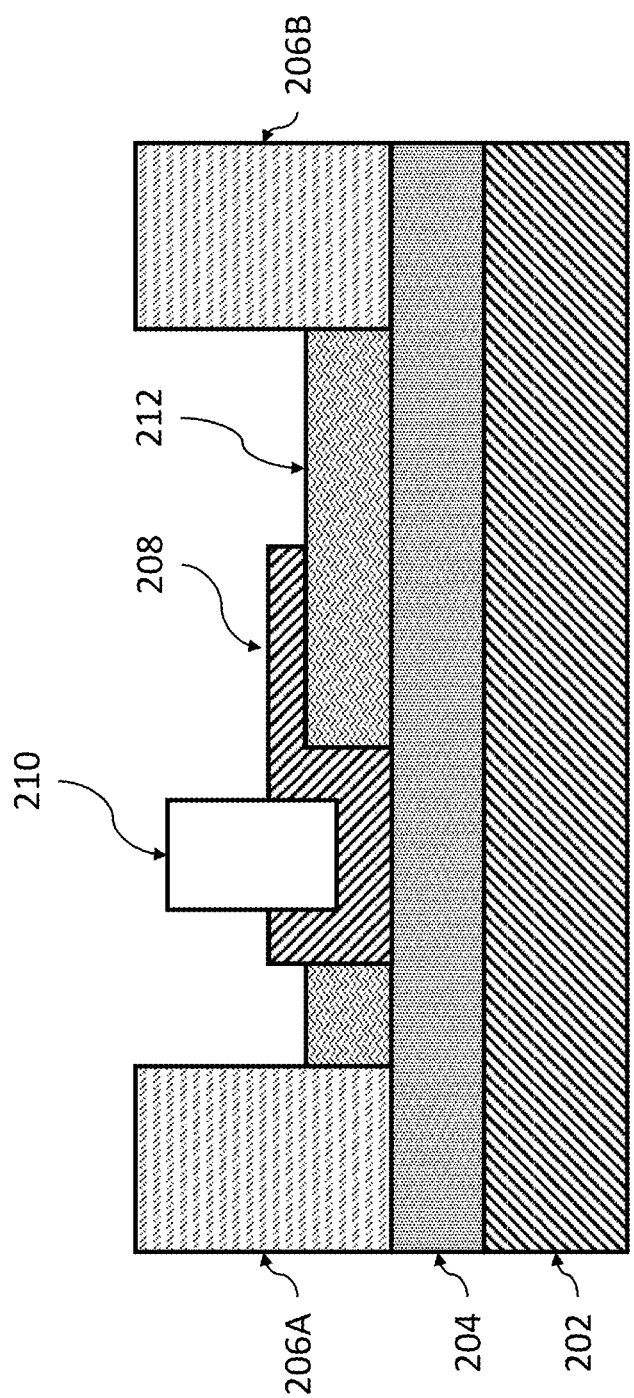
FIG. 10 illustrates another embodiment where the dielectric layer has been etched.
Figure 11:
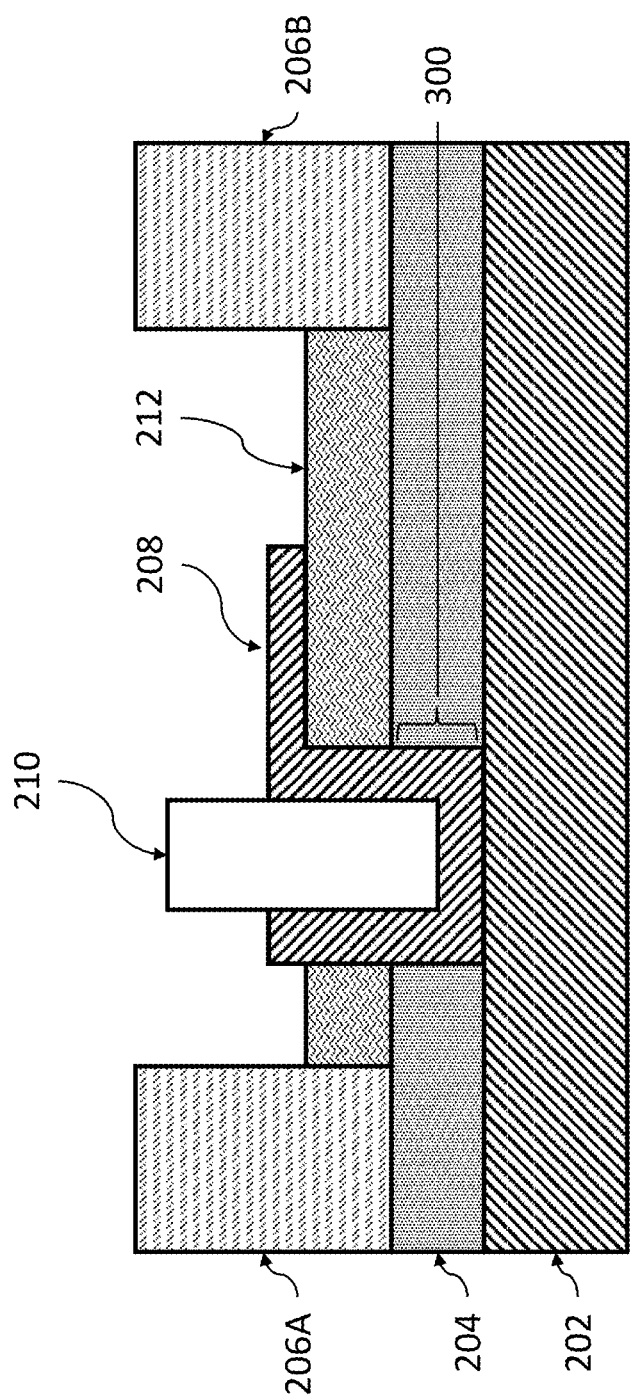
FIG. 11 illustrates another embodiment where the dielectric layer has been etched and extends into the barrier layer.

FIGS. 10 and 11 are cross-sectional view of HEMTs according other embodiments. FIG. 10 is substantially similar to FIG. 8, except the dielectric layer 208 has been etched. Likewise, FIG. 11 is substantially similar to FIG. 9, except the dielectric layer 208 has been etched.

Figure 12A:
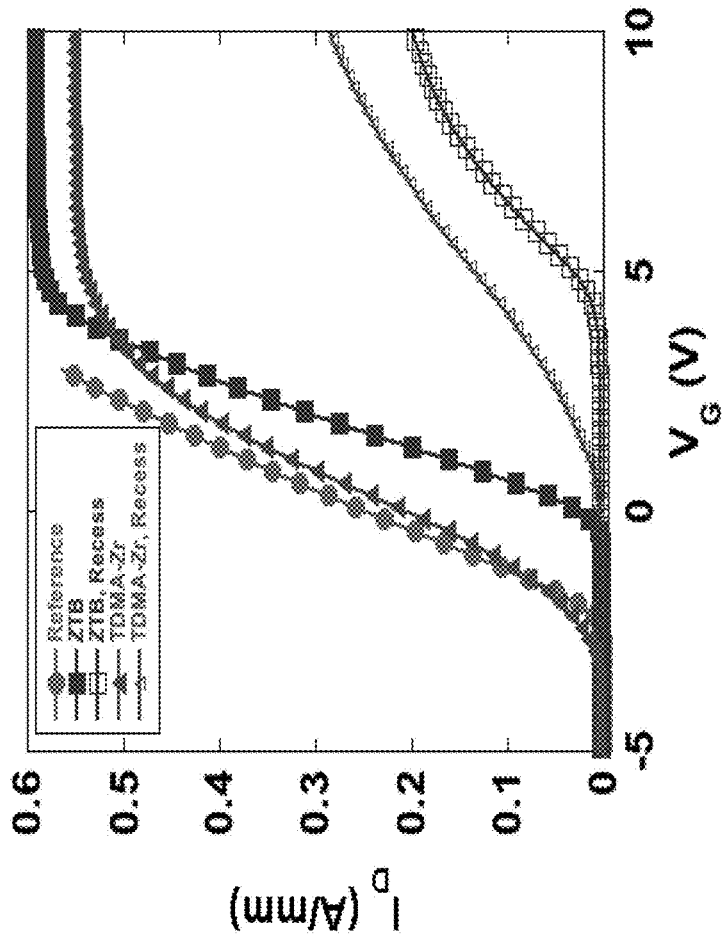
FIG. 12A-C shows source-drain current versus gate voltage test results for different HEMTs.
Figure 12B:
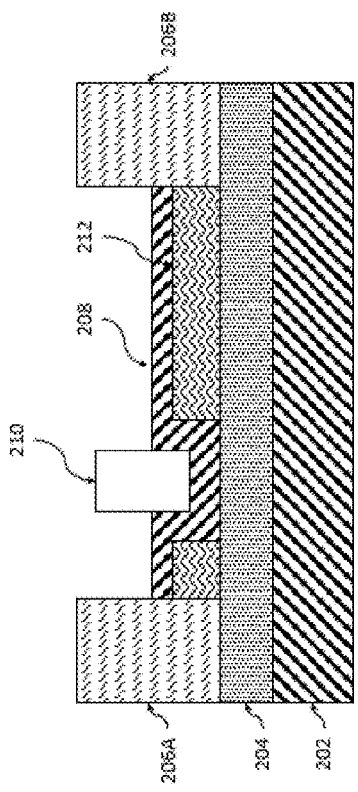
Figure 12C:
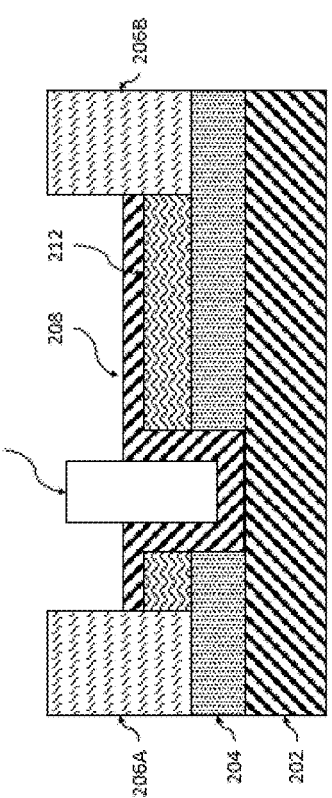

FIG. 12A-C shows current-voltage test results for four different HEMTs produced by techniques described above. Specifically, non-recessed HEMTs (FIG. 12B) formed using ZTB and TDMA-Zr precursors, respectively, are compared to recessed HEMTs (FIG. 12C) formed using ZTB and TDMA-Zr precursors, respectively. These HEMTs are also compared to a conventional Schottky-gated reference HEMT that does not include a $ZrO_2$ dielectric layer 208. The x-axis indicates the gate voltage applied to gate 210. The y-axis indicates the current passing between the source 206A and the drain 206B. Starting from the left in FIG. 12A, both the reference HEMT device and the non-recessed TDMA-Zr HEMT device show negative turn-on voltages of −2.11V and −3.15V, respectively. Next, the non-recessed ZTB HEMT device shows a turn-on voltage of −0.264 V, which is approaching enhancement mode. Next, the recessed TDMA-Zr HEMT device shows a turn-on voltage of 0.113, making it an enhancement mode device. Finally, the recessed ZTB HEMT device shows a turn-on voltage of 3.92 volts. From these results, it is clear that ZTB precursor devices exhibit higher turn-on voltages than TDMA-Zr precursor devices. As discussed above, this is due to the presence of negative charge in the oxide film resulting from excess oxygen in the $ZrO_2$ film as a result of using the ZTB precursor. In contrast, the TDMA-Zr devices exhibit a negative voltage shift compared to the reference device due to a thicker effective barrier. Nevertheless, with both precursors, the presence of a full barrier recess had a positive shift in threshold voltage and resulted devices that operated in enhancement mode. Table 1 below summarizes the test results for these devices.

TABLE 1

| | Reference | ZTB | ZTB Gate Recess | TDMA-Zr | TDMA-Zr Gate Recess |
|---|---|---|---|---|---|
| $V_T$ (V) | −2.11 | −0.264 | +3.92 | −3.15 | +0.113 |
| $I_{D,MAX}$ (A/mm) | 0.565 | 0.592 | 0.198 | 0.551 | 0.285 |
| $g_{m,MAX}$ (mS/mm) | 122 | 150 | 53.9 | 112 | 39.7 |
| $R_{ON}$ (Ω-mm) | 17.1 | 9.93 | 22.7 | 10.9 | 24.5 |
| $\Delta R_{ON,DYN}$ (%) | 27.5 | 412 | 511 | 21 | 1 |

Figure 13B:
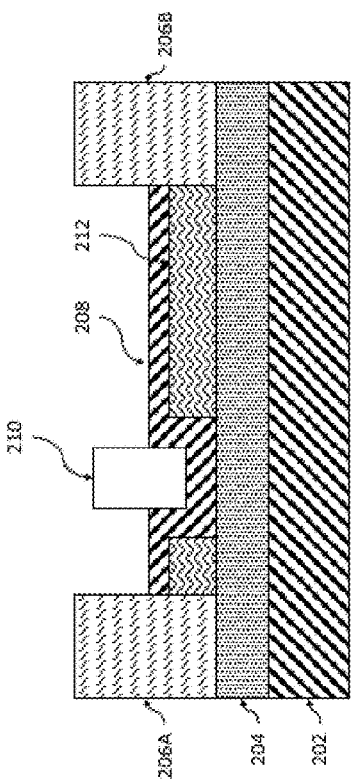
FIG. 13A-C show gate leakage measurement results for different HEMTs.
Figure 13C:
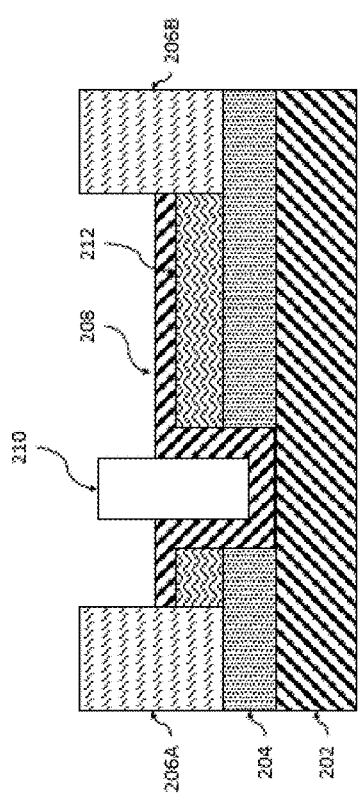
Figure 13A:
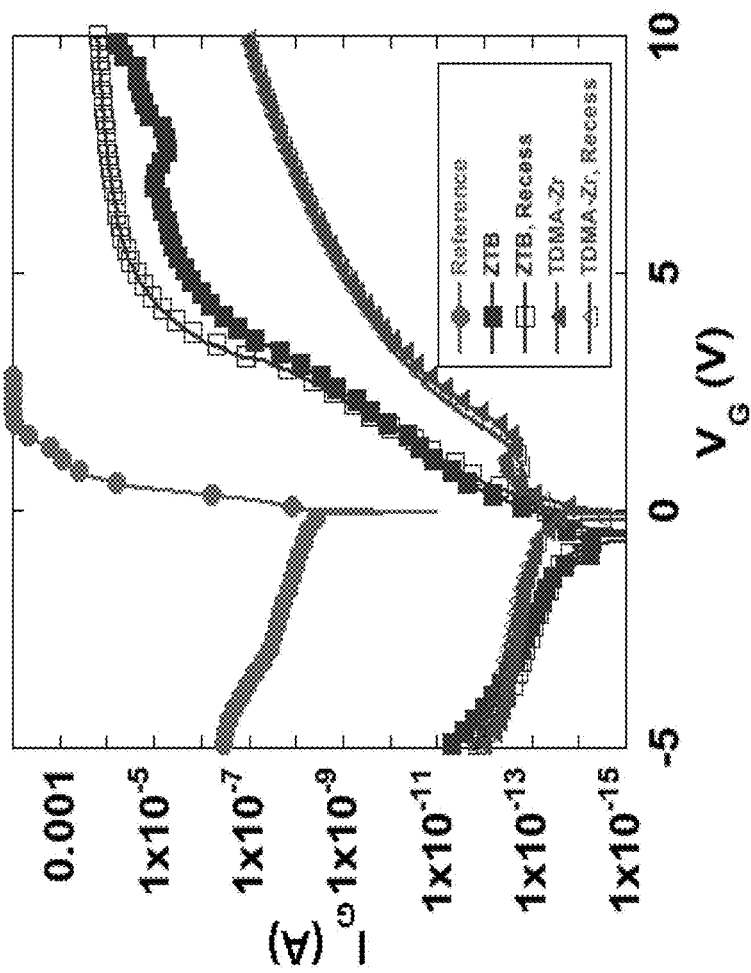

FIG. 13A-C show current-voltages tests for the HEMT devices shown in FIGS. 12B-C, reproduced as FIGS. 13B-C. Here, the leakage current is measured through the gate 210 as the voltage applied to the gate 210 is changed. Both the ZTB and TDMA-Zr HEMT devices, in recessed and non-recessed forms, show leakage currents that are four orders of magnitude—if not more—lower than the reference device.

While various example embodiments of the invention have been described above, it should be understood that they have been presented by way of example, and not limitation. It is apparent to persons skilled in the relevant art(s) that various changes in form and detail can be made therein. Thus, the disclosure should not be limited by any of the above described example embodiments, but should be defined only in accordance with the following claims and their equivalents.

In addition, it should be understood that the figures are presented for example purposes only. The architecture of the example embodiments presented herein is sufficiently flexible and configurable, such that it may be utilized and navigated in ways other than that shown in the accompanying figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures recited in the claims need not be performed in the order presented.

What is claimed is:

1. A high electron mobility transistor, comprising:
   a source;
   a drain;
   a GaN layer;
   a barrier layer disposed on the GaN layer;
   a gate metal; and
   a zirconium oxide dielectric layer at least partially surrounding the gate metal, wherein the zirconium oxide dielectric layer comprises a zirconium oxide film formed from a zirconium (IV) tert-butoxide precursor, and
   wherein the zirconium oxide dielectric layer further comprises another zirconium oxide film formed from a tetrakis (dimethylamino) zirconium (TDMA-Zr) precursor.

2. The transistor according to claim 1, further comprising:
   a recess in the barrier layer in the a region of the gate metal,
   wherein the zirconium oxide dielectric layer is disposed in the recess in the barrier layer.

3. The transistor according to claim 2, wherein the recess in the barrier layer extends to the GaN layer.

4. The transistor according to claim 2, wherein a current conducting channel is formed in the GaN layer when a threshold voltage is applied to the gate metal.

5. The transistor according to claim 4, wherein the current conducting channel is a two-dimensional electron gas.

6. The transistor according to claim 2, wherein the transistor is an enhancement mode device.

7. The transistor according to claim 2, wherein the transistor has a positive turn-on voltage.

8. The transistor according to claim 1, wherein a thickness of the zirconium oxide film formed from the zirconium (IV) tert-butoxide precursor is different from a thickness of the other zirconium oxide film formed from the TDMA-Zr precursor.

* * * * *